United States Patent [19]

Heaslip

[11] Patent Number: 5,101,372
[45] Date of Patent: Mar. 31, 1992

[54] OPTIMUM PERFORMANCE STANDARD CELL ARRAY MULTIPLIER

[75] Inventor: Jay G. Heaslip, Williston, Vt.

[73] Assignee: International Business Machines Corporation, Armonk, N.Y.

[21] Appl. No.: 589,564

[22] Filed: Sep. 28, 1990

[51] Int. Cl.⁵ .............................................. G06F 7/52
[52] U.S. Cl. .................................................. 364/758
[58] Field of Search ........................ 364/756, 757–760

[56] References Cited

U.S. PATENT DOCUMENTS

| | | | |
|---|---|---|---|
| 4,168,530 | 9/1979 | Gajski et al. | 364/760 |
| 4,556,948 | 12/1985 | Mercy | 364/757 |
| 4,575,812 | 3/1986 | Kloker et al. | 364/760 |
| 4,736,335 | 4/1988 | Barkan | 364/758 |
| 4,748,583 | 5/1988 | Noll | 364/758 |
| 4,752,905 | 6/1988 | Nakagawa | 364/760 |

Primary Examiner—Tan V. Mai
Attorney, Agent, or Firm—Sughrue, Mion, Zinn, Macpeak & Seas

[57] ABSTRACT

A cell array multiplier uses unique adder interconnections to increase the multiplier output speed. More specifically, adder connections for each column of the multiplier are generated by maintaining a list of available inputs for each column. Three inputs are assigned to each full adder, wherein the inputs are chosen from the list based upon the time delay before the input is available. Once three inputs are chosen and assigned to an adder, these inputs are deleted from the list and the sum of the newly assigned adder is added to the list. This process is repeated until only a sum remains on the list, which represents the output of that column. By using this method, each stage of each column is assigned the earliest available inputs possible for the column and stage in question. The present invention uses estimates of the time delays of the sum and carry for each full adder. To generate the most efficient configuration, accurate sum and carry delay estimates are necessary.

9 Claims, 6 Drawing Sheets

OPTIMUM PERFORMANCE STANDARD CELL ARRAY MULTIPLIER

BACKGROUND OF THE INVENTION

This invention relates to a cell array multiplier design which uses unique internal connections to increase the speed of the multiplier output by minimizing overall delay, given sum and carry delays for a full adder.

Traditionally, array multiplier performance was increased in one of three standard ways. First, recoding techniques, such as Booth's algorithm, have been used to reduce the number of partial products to be added within the multiplier. By using Booth's algorithm to reduce the partial products, the number of full adder (FA) columns was reduced, as shown by U.S. Pat. No. 4,168,530. Another example using Booth's algorithm is U.S. Pat. No. 4,575,812, which reduces the propagation delay by connecting each sum to a FA within the same column and two stages beyond that sum's stage. However, recoding techniques are not overly efficient when implementing both signed two's complement and unsigned multiplication, which the present invention does in fact implement. In order to provide signed and unsigned multiplication, the Baugh-Wooley multiplication algorithm was used as a design base.

The second area of potential performance enhancement involves variations in circuit design intended to speed up the longest signal path within the multiplier. The longest path is generally the carry path. However, multiplier arrays often do not have the freedom to use circuit design techniques, since they are implemented using a predetermined set of circuits, such as those used on the DCP-C CMPhilo chip. As a result, the logical operations available for design are limited to the specified chip's set, such as a CMPhilo bookset.

The third area of performance enhancement involves variations on the interconnection scheme, such as a Wallace tree or Binary tree, which are used to reduce the signal path lengths. The assumption made when using a Binary tree is that carry delays through the full adder are negligible. Unfortunately, this is rarely the case. As a result, the Binary tree algorithm produces a less than optimal interconnection strategy. The improvement provided by the present invention improves on the interconnection strategy.

Previous multipliers have used a very basic structure, as disclosed in U.S. Pat. No. 4,748,583, which shows sum and carry signals from each adder connected to adders within the next stage. Alternatively, VLSI circuits have been adapted to increase multiplier speed by reducing the number of stages and connecting carry signals to full adders beyond the next stage. For instance, U.S. Pat. No. 4,752,905 discusses connecting each carry signal to a FA two stages beyond that carry signal's stage, while U.S. Pat. No. 4,556,948 discloses connecting each carry signal to FA's up to six stages thereafter.

However, most custom designs are concerned with making interconnections regular or symmetrical in order to simplify the chip's layout, which in turn affects the chip density and performance. This symmetry of layout affects the choice of interconnection schemes and also determines whether more than one adder type will be used within the multiplier; for instance, whether to use a carry look-ahead (CLA) adder in some of the stages instead of a less complex ripple adder.

The present invention is not limited to the less complex ripple adders, since it utilizes a standard cell design system. The present invention also is not concerned with the effects of complex interconnection schemes upon the density of the chip, since the standard cell design system was a more limiting factor upon chip density. Moreover, the present invention is not concerned with using more complex CLA adders within the multiplier, since the performance improvement achieved by using these adders was considered to outweigh the increase in area. Because of the constraints imposed by the standard cell design system, the only area of improvement was in the interconnection of the full adders which sum the partial products, in conjunction with using a CLA adder for the last stage. Using a CLA adder for the last stage of a multiplier by itself would not create a significant improvement in performance, since a CLA adder achieves maximum performance when its inputs arrive simultaneously, whereas inputs to the last stage of the inventive multiplier arrive as nearly simultaneously as possible, because of the unique interconnection scheme.

An object of the present invention is to provide a standard cell array multiplier within which a unique interconnection scheme provides a high speed multiplier.

A second object of this invention is to provide an interconnection scheme which uses irregular or asymmetrical connection layouts within the multiplier to reduce the longest signal path through the multiplier.

Another object of this invention is to provide a method for determining the optimal interconnection scheme, whereby the connections are dependent upon each adder's sum delay and carry delay.

SUMMARY OF THE INVENTION

The present invention involves a new method of configuring the adder interconnects within a multiplier to obtain the best performance possible. This method depends upon the ratio of carry delay to sum delay for the adders. Therefore, an optimal design will be produced if the carry and sum delay estimates are reasonably accurate. By taking carry delay into account, the present invention uses a more realistic full adder model, which in turn leads to a better resultant configuration. The technique is recursive, and so builds the next column within the multiplier based upon the estimated carry delays of the columns built previously. Determining interconnections from the first few columns is quite simple; however, the problem grows more complex as the number of columns increases, for instance, such as for a 16×16 multiplier.

The present invention is a method of full adder column generation, which consists of initially listing all the inputs to the column as elements of a list, sorting list elements based on their estimated delay values, and then assigning the element's inputs to adders. Beginning with the first adder, each adder of the column is assigned three inputs from this list during each iteration of the method. Each adder assignment results in new carry and sum signals; thus, the sum has to be added to the input list, while the three assigned inputs are deleted from the list. The carry signal is retained as an input for the next column. The input list of the present column is gradually reduced by assigning inputs to full adders until the list has only one element: the sum from the last adder in the column. At this point, the column is complete. This method is repeated for every adder of every column, thereby generating the most time efficient adder connection scheme.

The performance of the standard cell multiplier has been shown to be comparable to a custom 16×16 multiplier array designed in the same technology. The worst case performance based on actual wiring capacitance is 63 ns.

DETAILED DESCRIPTION OF THE PREFERRED EMBODIMENT

In the following description of the preferred embodiment of the present invention, it is assumed that all partial products are available at the same time which is designated as time 0. Also, the carry delay for each full adder is assumed to be 3 ns, and the sum delay is assumed to be 4 ns. For the purposes of describing the algorithm, it is assumed that the multiplier performs unsigned multiplication.

Figure 6:
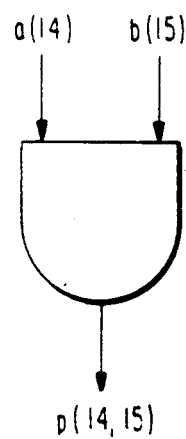
FIG. 6. is a block diagram representing a partial product of the present invention.

The following notation will be used to describe the present invention: the multiplier inputs are designated by a(0...15) and b(0...15), which are sixteen bit signals. The partial products are designated by p(X,Y), wherein X and Y denote the inputs from which the partial products are derived. For example, p(14, 15) is equal to a(14) ANDED with b(15), as shown in FIG. 6. The multiplier output is designated by r(0...31), which is a thirty-two bit signal. Intermediate adder carry signals are denoted by c(X,Y) where X is the column number from which the carry is generated, and Y is the full adder within the column. Intermediate sums are denoted in a similar manner by s(X,Y).

Figure 4A:
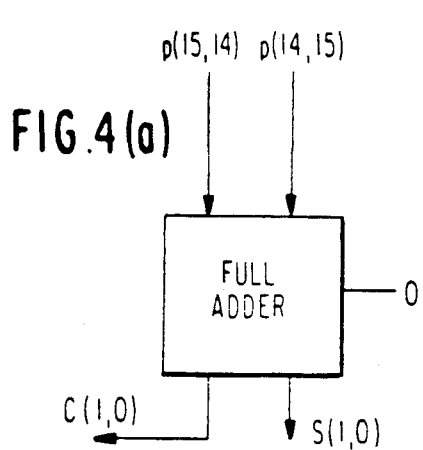
FIG. 4(a) is a block circuit diagram of column 1 of the multiplier of the preferred embodiment of the present invention.

The method of the present invention is most clearly understood by reference to an example, as set forth in FIG. 4(a), which shows the generation of the output S(1,0) of column 1, which requires one half adder. The carry signal C(1,0) of this adder becomes an input for column 2. To generate the optimum column 2 connections, first a list of column 2 inputs must be generated. The inputs to each column come from one of two sources; either the partial products of the corresponding inputs or the carry signals from the previous column.

The partial products of corresponding inputs for each column are determined by the two following ;) series:

$$P(15-n, 15+n-y); \text{for } y \leq 15, \text{ and } n=0,...,y, \quad (1)$$

$$P(30-y-n, n) ; \text{for } y > 15, \text{ and } n=0,...,30-y, \quad (2)$$

where y equals the column, P(15-n,15+n-y) equals the partial product of inputs a(15-n) and b(15+n-y), and P(30-y-n, n) equals the partial product of a(30-y-n) and b(n).

Each partial product and carry signal included on the list represents elements of the list. Each list element specifies the output signal name (i.e. C(x,y) or S(x,y)) and that signal's accumulated delay. The accumulated delay represents the interval between the time the inputs a(x) and b(y) are available, and time the output signal is available. Each partial product has no delay, since partial products are immediately available, while each carry has at least a 3 ns delay.

Figure 4B:
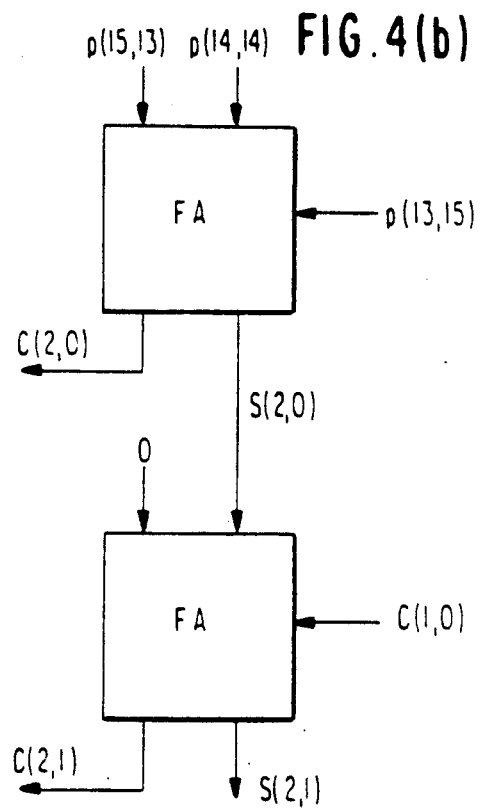
FIG. 4(b) is a block circuit diagram of column 2 of the multiplier of the preferred embodiment of the present invention.

Referring to FIG. 4(b), the initial list of column 2 is as follows:

[[p(13,15),0],[p(14,14),0],[p(15, 13),0],[C(1, 0),3]]

The three partial products, which were generated from series (1) above, have a 0ns delay, and the carry C(1,0) from column 1 has a delay of 3 ns. These time delays are used to order the list elements in ascending delay order. Thereafter, the present invention groups the first three elements of the list as one set of full adder inputs to the first adder in column 2 (Fig. 4(b)). This adder generates a sum S(2,0), which is added to the list as a new element, wherein a 4 ns time delay is associated therewith. The partial products connected to this adder are removed from the list, since they are no longer available inputs for this column. Next, the list is resorted by delay, thereby rendering the elements of the list ordered by ascending time delays, as follows:

[[c(1,0),3],[s(2,0),4]]

The input list now has only two elements, which are grouped as a set of half adder inputs to produce the final list or final output:

[[s(2,1),8]]

The final list shows that the sum for column 2 has an estimated delay of 8 ns. This delay is cumulative, reflecting the delay of S (2,0) plus the delay caused by the second FA of column 2.

As inputs are assigned, each full adder also generates a carry signal for the next column, which is added to the carry list. The final carry list of column 2 is as follows:

[[c(2,0),3],[c(2,1),7]]

It should be noted that the carry C(2,0) from the first adder has a 3 ns delay, while the second carry has a 7 ns delay. The 7 ns delay is an representative of the delays from the sum S(2,0) and the carry delay within the second FA of column 2. This will be used as a part of the input list when generating column 3.

This process seems relatively straightforward for simple designs as described above. However, when considering a larger column, such as column 14, the possible inputs grow complex and computer assistance becomes helpful.

Before describing column 14 of the multiplier of the present invention, it will be useful to show a corresponding layout for a known multiplier.

Figure 1:
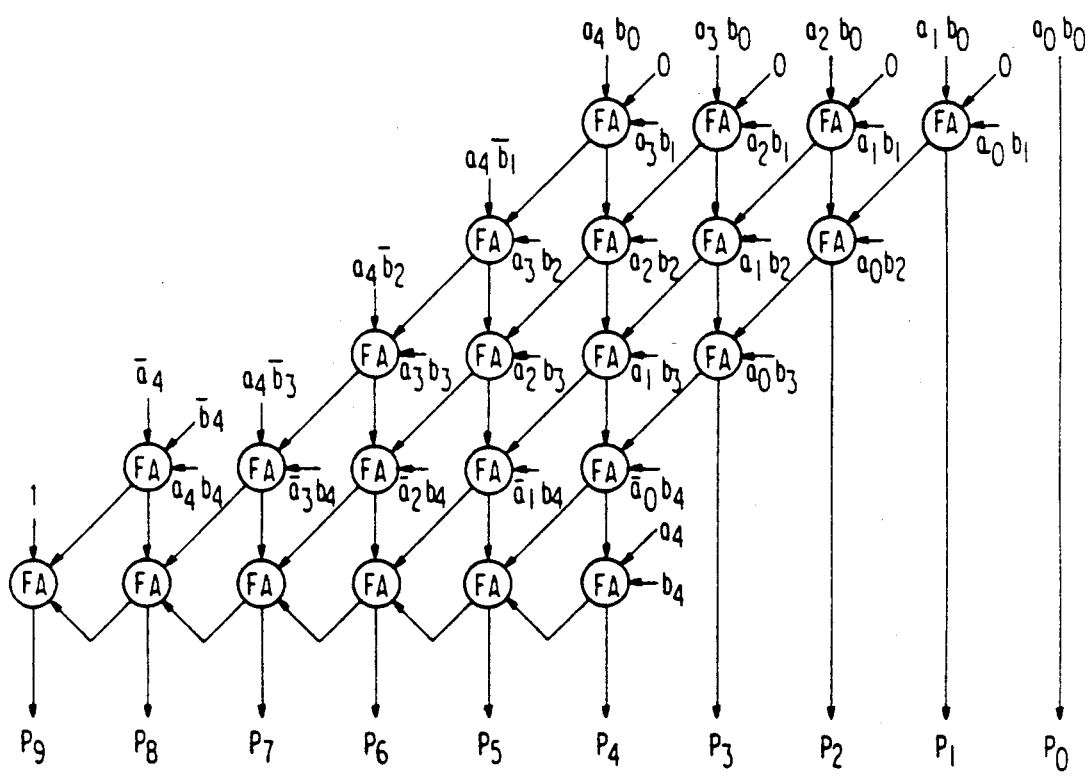
FIG. 1 is a block circuit diagram of a conventional cell-structured 5×5 digital multiplier.
Figure 2:
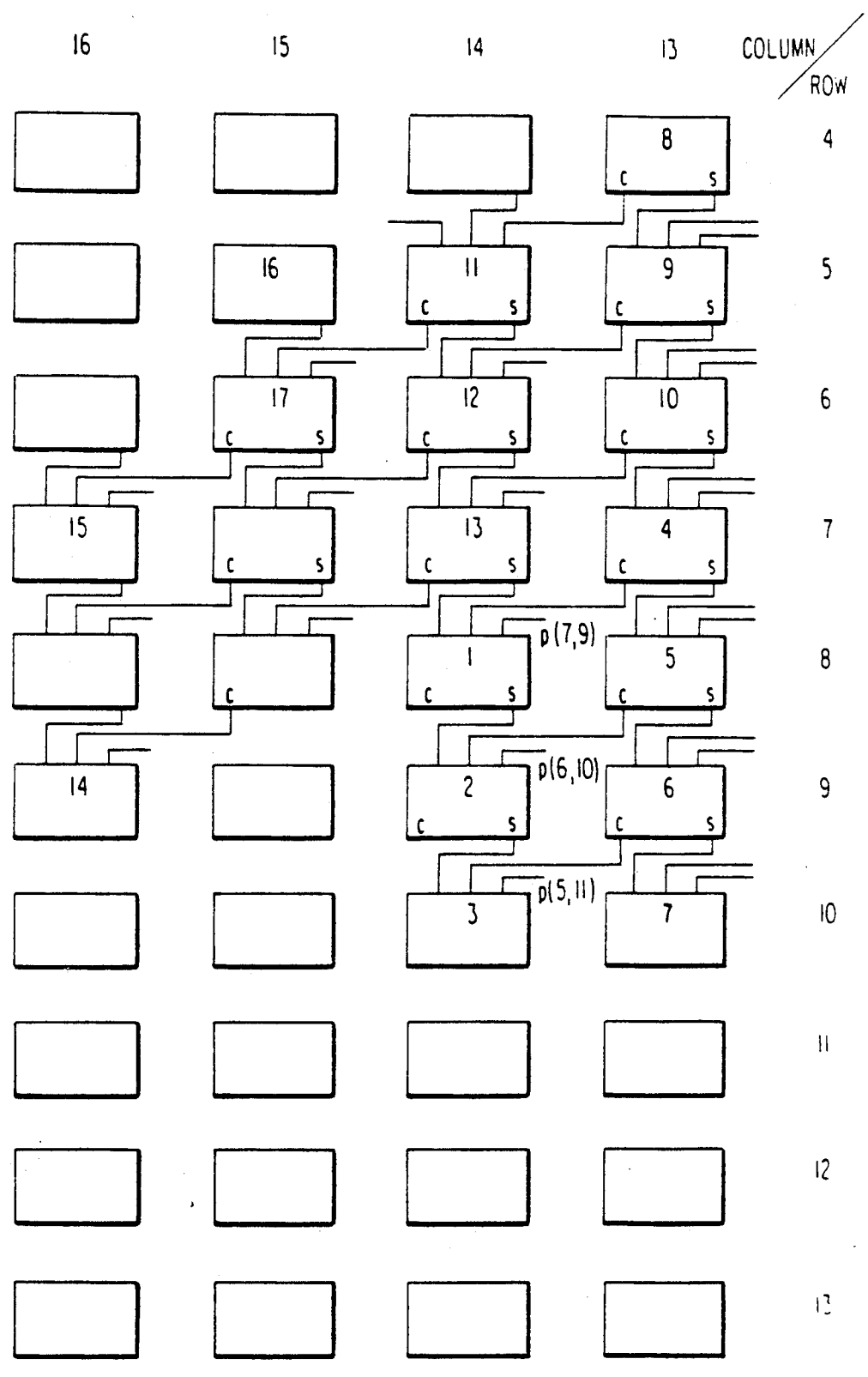
FIG. 2 is a block circuit diagram of a section of a 16×16 conventional multiplier.

The block diagram illustrated in FIG. 1 corresponds to a conventional 5×5 multiplier. FIG. 2 corresponds to a section of a known 16×16 multiplier; namely columns 13–16 and rows 4–12. Full adder (FA) 1, which corresponds to the 9th stage (row) in column 14, accepts as inputs the sum from FA 13, the carry from FA 4 and the partial product of p(7,9). Similarly, FA 2 connects with the sum of FA 1, the carry of FA 5, and the partial product p(6,10), and FA 3 connects with the sum of FA 2, the carry of FA 6, and the partial product of p(5,11). Thus, the symmetrical connection layout of the known multiplier is very apparent.

This circuit's negative effects on multiplier speed are also very apparent. In reference to FIG. 2, FA 4 has a 4 ns delay between its input and sum output, which connects with FA 1. The sum of FA 1 adds 4 ns to the column's delay, and FA 2's sum adds another 4 ns delay. Therefore, the delay between the input to FA 4 and the sum output from FA 3 is 16 ns. Extrapolating this delay to the beginning of column 14, there will be a 44 ns delay from the time the inputs a and b are available until FA 3 outputs its sum, whereas the present invention only has a 15 ns delay from the time the inputs are available until the output of an adder 103 of the present invention which corresponds to FA 3 is available, as described hereafter.

Figure 3:
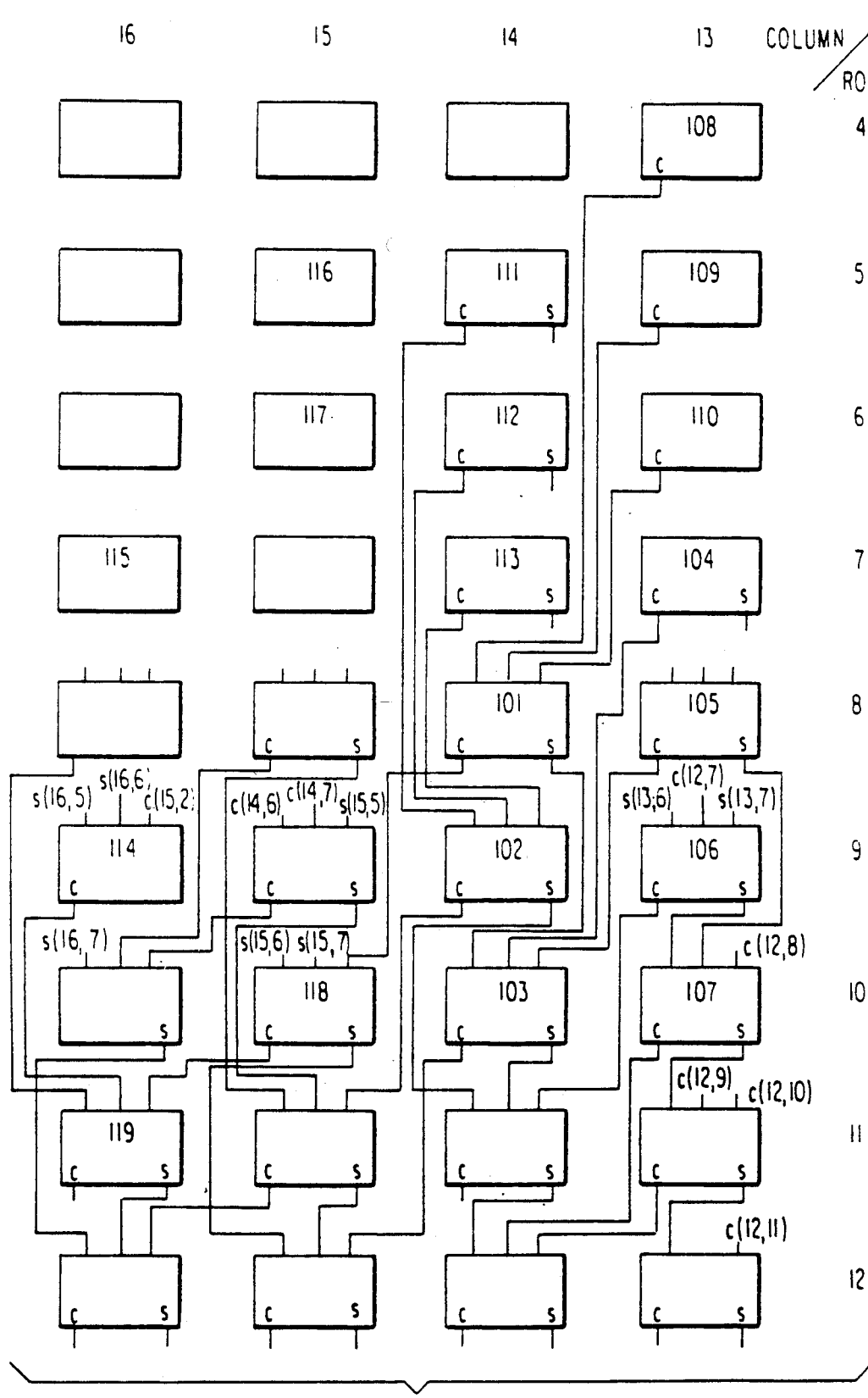
FIG. 3 is a block circuit diagram of a section of the present invention within a 16×16 multiplier.

FIG. 3 shows full adder connections of the present invention, corresponding to the full adder rows and columns shown in FIG. 2. More specifically, FIG. 3 shows some connections within columns 13–16 between FA 101–118. FA 101 obtains its inputs from the carry signals of FA 108, 109, and 110, while FA 102 gains as its inputs, the sum outputs of FA 111, 112, and 113, and FA 103 secures its inputs from the carry signals of FA 104 and 105, and the sum output from FA 101.

The connections of column 14 will be described hereafter. As described for columns 1 and 2 above, the present invention begins with creating a list of available inputs for column 14, which includes any partial products, generated by equation (1) above (with y=14), and the carry signals retained from column 13. It should be noted that every carry signal has a delay greater than 0, since these carries have accumulated delays from their corresponding FA carry paths, while every partial product has a 0 time delay.

The initial list (ordered in ascending order) for column 14 is shown in Table 1), from which the first three elements 18, 19, and 20 are used as inputs for the first adder of the column (not shown). This initial list is generated by the series of equation 1 for Y=14. This adder generates a sum S(14,0), which is placed on the list as element 21 (element (b) of Table 1) while elements 18, 19 and 20 are deleted. Note this sum has a 4 ns delay. This process of ordering, assigning and replacing elements is repeated throughout the column. Elements (i), (j), and (k) of Table 1 show the available input list for adders 101, 102, and 103 of FIG. 3, respectively. The first three elements (22, 23, and 24) of the list of element (i) of Table 1 act as inputs for FA 101. These elements correspond to the carry of FA 108, C(13,4), the carry of FA 109, C(13,5), and the carry of FA 110, C(13,6). These signals combine to form the sum output of FA 101, S(14,8), which is placed back onto the available input list as element 25 in element (j) of Table 1. Element 25 is given an 11 ns delay, which corresponds to the 7 ns delay of the slowest input to FA 101 (element 24) plus the 4 ns delay within FA 101. This process is reiterated for the available input list in element (j) of Table 1, from which elements 26, 27, and 28 are chosen as inputs for FA 102. As a result, the following inputs for FA 102 are generated: the sum output of FA 111,  S(14,5), the sum output of FA 112, S(14,6), and the sum output of FA 113, S(14,7). Accordingly, these sums are deleted from the available input list, and the sum of FA 102 is added as element 29, element (k) of Table 1.

It is important to note that the carry output list of column 14 has been continually updated as described above with reference to column 2. In other words, each time a FA's sum output is placed on the available input list, that FA's carry output is placed on a carry list. The carry list is used to retain the accumulated delay of each carry output. Once column 14 is configured (i.e. the FA connections are generated) these carries are used as inputs for the next column generation. After the output for FA 102 is generated, the carry list includes the following signals and delays:

[ {c(14,0),3} {c(14,1),3} {c(14,2),3} {c(14,3),3}
{c(14,4),3} {c(14,5),6} {c(14,6),7} {c(14,7),7}
{c(14,8),10} {c(14,9),11} ]

FIG. 3 also shows an example carry path derived by the present invention.

FA 101 receives the carrys from FA's 108, 109, and 110, as determined by the example described above. The largest delay is 7 ns from FA 110, therefore the carry output of FA 101 is 10 ns. This carry is therefore connected to FA 118 in column 15, when repeating the column generation method. FA 118 outputs its carry signal with a delay of 13 ns, which is connected to FA 19 of column 16. This description of the connections between FA 101, 118, and 119, shows an example carry path determined by same method used to generate column 14. Therefore, the details of how to generate columns 15 and 16 were omitted.

Figure 5:
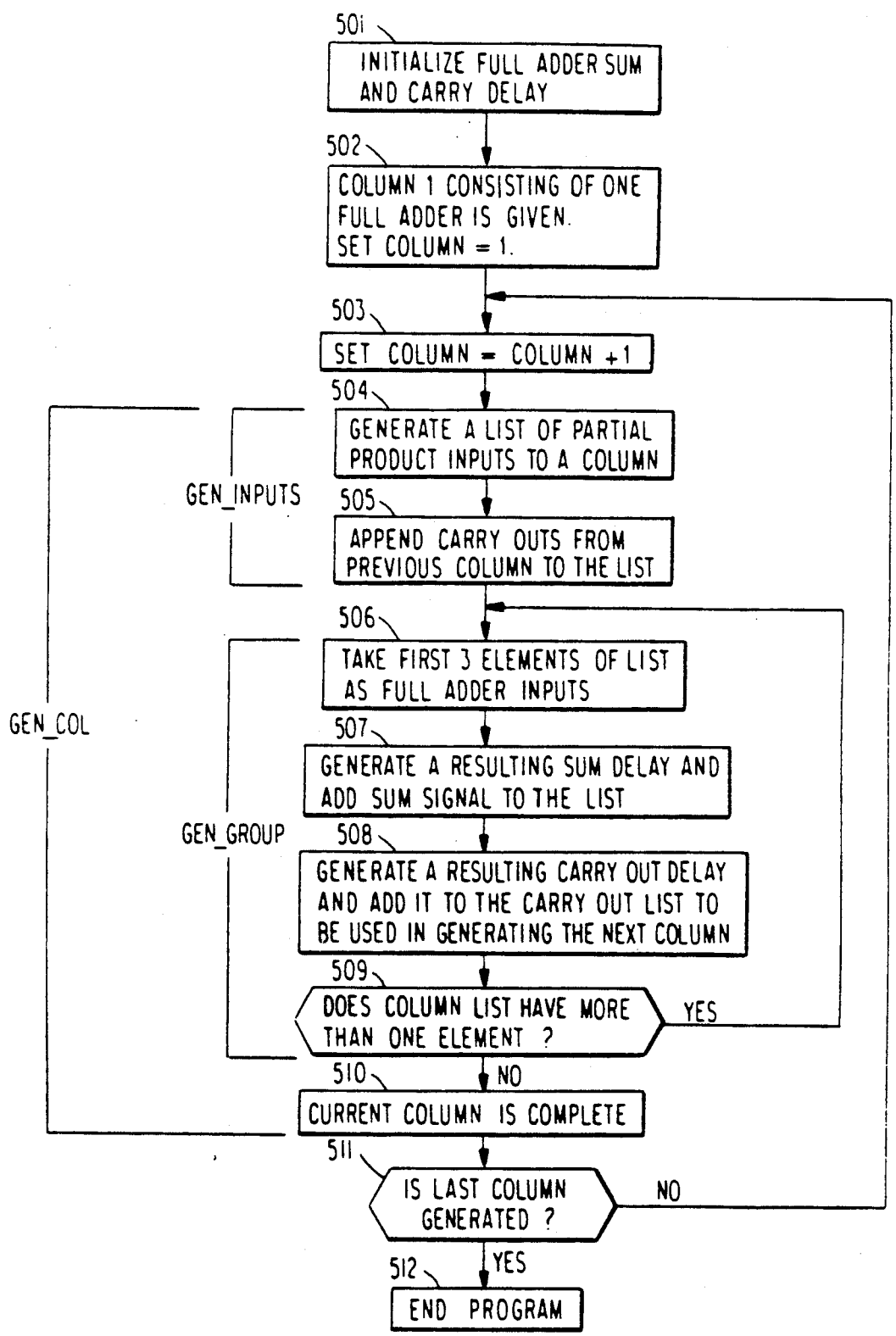
FIG. 5 is a flowchart representing the method of the present invention.

FIG. 5 shows a flowchart for the method of the present invention. This method begins by initializing the FA sum and carry delays (step 501), and setting the output for column 1 (step 502). Next the column counter is incremented (step 503), and the column's initial list is generated (step 504). This list includes partial products and the carrys from the previous column (step 505). Thereafter, the first three elements on the list are chosen as inputs for an adder (step 506), and the adder's sum (step 507) and carry (step 508) are added to the corresponding lists. If the list is determined to include a single element (i.e. the column's output) (step 509), then the method moves to the next column (step 510). However, if the list contains more than one element, the method repeats steps 506–509. At step 511, if the column counter is not at the last column, the method repeats steps 503–511 for the next column. After every column has been generated (step 511), the method ends (step 512).

Table 2 shows all of the FA connections for columns 2–30 of the present embodiment of the invention. For instance, element (m) of Table 2 shows the input set 60 corresponding to FA 101, element (n) of Table 2 shows the input set 61 corresponding to FA 118, and element (o) of Table 2 shows the input set 62 corresponding to FA 119. Columns 1 and 31 do not use full adders since there are only two inputs for each.

Table 3 shows the program used to implement the method of the present invention, in accordance with the flow chart of FIG. 5.

Figure 7:
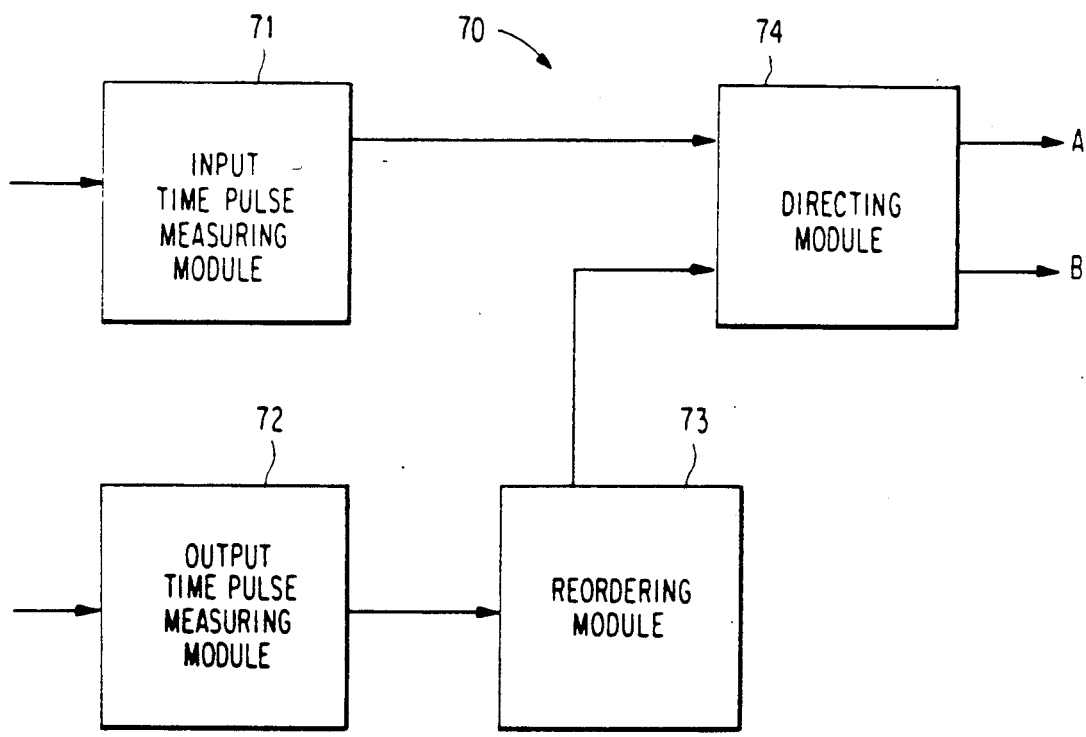
FIG. 7 represents a block diagram of the apparatus of the present invention.

FIG. 7 illustrates the apparatus by which the above method is performed. The apparatus 70 accepts includes input and output time pulse measuring modules 71 and 72. The input time pulse measuring module 71 measures the time value of each input pulse applied to each of said adder circuits in each row of said array to provide a plurality of input time pulses. The output time pulse measuring module 72 measures the time value of each output pulse of each of said adder circuits in each row of said array to provide a plurality of output time pulses. The list of output time pulses from module 72 is input to ordering module 73 arranging these output pulses in order. Thereafter, the ordered output pulses and the input pulses are transferred to the directing module 74 which directs the adder circuit outputs to inputs of other adder circuits based on the order in which the adder outputs are arranged. More specifically, directing module 74 directs each adder circuit output (along line A), being directed serially to another adder circuit in the same column, to one of the inputs of an adder circuit in the same column whose other inputs have time value equal to the selected outputs time value pulse or equal to the next greatest available time value. The directing module similarly directs each adder circuit output (along line B), being directed to an additional column, to an adder circuit whose other inputs have a time value equal to a time value of the selected output or equal to the next greatest available time value.

Although the invention has been described with respect to a preferred embodiment, it is not to be so limited as changes and modifications can be made which are within the full intended scope of the invention as defined by the appended claims.

TABLE 1

List Reduction Process for column 14

Starting with initial list of inputs to column 14 and ending with the final list of one element.

(a)
  18         19        20
{{p(15,1),0},{p(14,2),0},{p(13,3),0},{p(12,4),0},{p(11,5)0},{p(10,6),0},{p(9,7),0},{p(8,8),0},{p(7,9),0},{p(6,10),0},{p(5,11)0,},{p(4,12),0}{p(3,13),0},{p(2,14),0},{p(1,15),0},{c(13,0),3},{c(13,1),3},{c(13,2),—10,3},{c(13,3),3},{c(13,4),6},{c(13,5),6},{c(13,6),7},{c(13,7),10},{c(13,8),10},{c(13,9),14},{c(13,10),18},{c(13,11),37},{c(13,12),41}}.

(b)
{{p(12,4),0},{p(11,5),0},{p(10,6),0},{p(9,7),0},{p(8,8),0},{p(7,9),0},{p(6,10),0},{p(5,11),0},{p(4,12),0},{p(3,13),0},{p(2,14),0},{p(1,15),0
                                                   21
},{c(13,0),3},{c(13,1),3},{c(13,2),3},{c(13,3),3},{s(14,0),4},{c(13,4),6},{c(13,5),6},{c(13,6),7},{c(13,7),10},{c(13,8),10},{c(13,9),14},{c(13,10),18},{c(13,11),37},{c(13,12),41}}.

(c)
{{p(9,7)0},{p(8,8),0},{p(7,9),0},{p(6,10),0},{p(5,11),0},{p(4,12),0},{p(3,13),0},{p(2,14),0},{p(1,15),0},{c(13,0),3},{c(13,1),3},{c(13,2),3},{c(13,3),3},{s(14,0),4},{s(14,1),4},{c(13,4),6},{c(13,5),6},{c(13,6),7},{c(13,7),10},{c(13,8),10},{c(13,9),14},{c(13,10),18},{c(13,11),37},{c(13,12),41}}.

(d)
{{p(6,10),0},{p(5,11),0},{p(4,12),0},{p(3,13),0},{p(2,14),0},{p(1,15),0},{c(13,0),3},{c(13,1),3},{c(13,2),3},{c(13,3),3},{s(14,0),4},{s(14,1),4},{s(14,2),4},{c(13,4),6},{c(13,5),6},{c(13,6),7},{c(13,7),10},{c(13,8),10},{c(13,9),14},{c(13,10),18},{c(13,11),37},{c(13,12),41}}.

(e)
{{p(3,13),0},{p(2,14),0},{p(1,15),0},{c(13,0),3},{c(13,1),3},{c(13,2),3},{c(13,3),3},{s(14,0),4},{s(14,1),4},{s(14,2),4},{s(14,3),4},{c(13,4),6},{c(13,5),6},{c(13,6),7},{c(13,7),10},{c(13,8),10},{c(13,9),14},{c(13,10),18},{c(13,11),37},{c(13,12),41}}.

(f)
{{c(13,0),3},{c(13,1),3},{c(13,2),3},{c(13,3),3},{s(14,0),4},{s(14,1),4},{s(14,2),4},{s(14,3),4},{s(14,4),4},{c(13,4),6},{c(13,5),6},{c(13,6),7},{c(13,7),10},{c(13,8),10},{c(13,9),14},{c(13,10),18},{c(13,11),37},{c(13,12),41}}.

(g)
{{c(13,3),3},{s(14,0),4},{s(14,1),4},{s(14,2),4},{s(14,3),4},{s(14,4),4},{c(13,4),6},{c(13,5),6},{c(13,6),7},{s(14,5),7},{c(13,7),10},{c(13,8),10},{c(13,9),14},{c(13,10),18},{c(13,11),37},{c(13,12),41}}.

TABLE 1-continued

List Reduction Process for column 14

Starting with initial list of inputs to column 14 and ending with the final list of one element.

(h)
{{s(14,2),4},{s(14,3),4},{s(14,4),4},{c(13,4),6},{13,5),6},{c(13,6),7},{s(14,5),7},{s(14,6),8},{c(13,7),10},{c(13,8),10},{c(13,9),14},{c(13,10),18},{c(13,11),37},{c(13,12),41}}.

(i)
   22        23       24
{{c(13,4),6},{c(13,5),6},{c(13,6),7},{s(14,5),7},{s(14,6),8},{s(14,7),8},{c(13,7),10},{c(13,8),10},{c(13,9),14},{c(13,10)18},{c(13,11),37},{c(13,12),41}}.

(j)
   26       27        28                                 25
{{s(14,5),7},{s(14,6),8},{s(14,7),8},{c(13,7),10},{c(13,8),10},{s(14,8),11},{c(13,9),14},{c(13,10),18},{c(13,11),37},{c(13,12),41}}.

(k)
     30        31        32       29
{{c(13,7),10},{c(13,8),10},{s(14,8),11},{s(14,9),12},{c(13,9),14},{c(13,10),18},{c(13,11),37},{c(13,12),41}}.

(l)
                                     33
{{s(14,9),12},{c(13,9),14},{s(14,10),15},{c(13,10),18},{c(13,11),37},{c(13,12),41}}.

(m)
{{c(13,10),18},{s(14,11),19},{c(13,11),37},{c(13,12),41}}.

(n)
{{c(13,12),41},{s(14,12),41}}.

(o)
{{s(14,13),45}}.

TABLE 2

Interconnects for a 16 × 16 Multiplier

Each list represents a set of full adder inputs.

(a) Grouping for Column 2
{{p(15,13),0},{p(14,14),0},{p(13,15),0}}.
{{c(1,0),3},{s(2,0),4}}.

(b) Grouping for Column 3
{{p(15,12),0},{p(14,13),0},{p(13,14),0}}.
{{p(12,15),0},{c(2,0),3},{s(3,0),4}}.
{{c(2,1),7},{s(3,1),8}}.

(c) Grouping for Column 4
{{p(15,11),0},{p(14,12),0},{p(13,13),0}}.
{{p(12,14),0},{p(11,15),0},{c(3,0),3}}.
{{s(4,0),4},{c(3,1),7},{s(4,1),7}}.
{{c(3,2),11},{s(4,2),11}}.

(d) Grouping for Column 5
{{p(15,10),0},{p(14,11),0},{p(13,12),0}}.
{{p(12,13),0},{p(11,14),0},{p(10,15),0}}.
{{c(4,0),3},{s(5,0),4},{s(5,1),4}}.
{{c(4,1),6},{s(5,2),8},{c(4,2),10}}.
{{c(4,3),14},{s(5,3),14}}.

(e) Grouping for Column 6
{{p(15,9),0},{p(14,10),0},{p(13,11),0}}.
{{p(12,12),0},{p(11,13),0},{p(10,14),0}}.
{{p(9,15),0},{c(5,0),3},{c(5,1),3}}.
{{s(6,0),4},{s(6,1),4},{c(5,2),7}}.
{{s(6,2),7},{s(6,3),11},{c(5,3),13}}.
{{c(5,4),17},{s(6,4),17}}.

(f) Grouping for Column 7
{{p(15,8),0},{p(14,9),0},{p(13,10),0}}.
{{p(12,11),0},{p(11,12),0},{p(10,13),0}}.
{{p(9,14),0},{p(8,15),0},{c(6,0),3}}.
{{c(6,1),3},{s(7,0),4},{s(7,1),4}}.
{{c(6,2),6},{s(7,2),7},{s(7,3),8}}.
{{c(6,3),10},{s(7,4),12},{c(6,4),16}}.
{{c(6,5),20},{s(7,5),20}}.

(g) Grouping for Column 8
{{p(15,7),0},{p(14,8),0},{p(13,9),0}}.
{{p(12,10),0},{p(11,11),0},{p(10,12),0}}.
{{p(9,13),0},{p(8,14),0},{p(7,15),0}}.
{{c(7,0),3},{c(7,1),3},{s(8,0),4}}.
{{s(8,1),4},{s(8,2),4},{c(7,2)6}}.
{{c(7,3),7},{s(8,3),8},{s(8,4),10}}.
{{c(7,4),11},{s(8,5),14},{c(7,5),19}}.
{{c(7,6),23},{s(8,6),23}}.

Grouping for Column 9

TABLE 2-continued

Interconnects for a 16 × 16 Multiplier
Each list represents a set of full adder inputs.

(h)  {{p(15,6),0},{p(14,7),0},{p(13,8),0}}.
{{p(12,9),0},{p(11,10),0},{p(10,11),0}}.
{{p(9,12),0},{p(8,13),0},{p(7,14),0}}.
{{p(6,15),0},{c(8,0),3},{c(8,1),3}}.
{{c(8,2),3},{c(9,0),4},{s(9,1),4}}.
{{s(9,2),4},{c(8,3),7},{s(9,3),7}}.
{{s(9,4),8},{c(8,4),9},{s(9,5),11}}.
{{c(8,5),13},{s(9,6),15},{c(8,6),22}}.
{{c(8,7),26},{s(9,7),26}}.

Grouping for Column 10
(i)  {{p(15,5),0},{p(14,6),0},{p(13,7),0}}.
{{p(12,8),0},{p(11,9),0},{p(10,10),0}}.
{{p(9,11),0},{p(8,12),0},{p(7,13),0}}.
{{p(6,14),0},{p(5,15),0},{c(9,0),3}}.
{{c(9,1),3},{c(9,2),3},{s(10,0)4}}.
{{s(10,1),4},{s(10,2),4},{c(9,3),6}}.
{{c(9,4),7},{s(10,3),7},{s(10,4),8}}.
{{c(9,5),10},{s(10,5),10},{s(10,6),12}}.
{{c(9,6),14},{s(10,7),16},{c(9,7),25}}.
{{c(9,8),29},{s(10,8),29}}.

Grouping for Column 11
(j)  {{p(15,4),0},{p(14,5),0},{p(13,6),0}}.
{{p(12,7),0},{p(11,8),0},{p(10,9),0}}.
{{p(9,10),0},{p(8,11),0},{p(7,12),0}}.
{{p(6,13),0},{p(5,14),0},{p(4,15),0}}.
{{c(10,0),3},{c(10,1),3},{c(10,2),3}}.
{{s(11,0),4},{s(11,1),4},{s(11,2),4}}.
{{s(11,3),4},{c(10,3),6},{c(10,4),7}}.
{{s(11,4),7},{s(11,5),8},{c(10,5),9}}.
{{c(10,6),11},{s(11,6),11},{s(11,7),13}}.
{{c(10,7),15},{s(11,8),17},{c(10,8),28}}.
{{c(10,9),32},{s(11,9),32}}.

Grouping for Column 12
(k)  {{p(15,3),0},{p(14,4),0},{p(13,5),0}}.
{{p(12,6),0},{p(11,7),0},{p(10,8),0}}.
{{p(9,9),0},{p(8,10),0},{p(7,11),0}}.
{{p(6,12),0},{p(5,13),0},{p(4,14),0}}.
{{p(3,15),0},{c(11,0),3},{c(11,1),3}}.
{{c(11,2),3},{c(11,3),3},{s(12,0),4}}.
{{s(12,1),4},{s(12,2),4},{s(12,3),4}}.
{{c(11,4),6},{c(11,5),7},{c(12,5),7}}.
{{s(12,5),8},{s(12,6),8},{c(11,6),10}}.
{{s(12,7),11},{c(11,7),12},{s(12,8),14}}.
{{c(11,8),16},{s(12,9),18},{c(11,9),31}}.
{{c(11,10),35},{s(12,10),35}}.

Grouping for Column 13
(l)  {{p(15,2),0},{p(14,3),0},{p(13,4),0}}.
{{p(12,5),0},{p(11,6),0},{p(10,7),0}}.
{{p(9,8),0},{p(8,9),0},{p(7,10),0}}.
{{p(6,11),0},{p(5,12),0},{p(4,13),0}}.
{{p(3,14),0},{p(2,15),0},{c(12,0),3}}.
{{c(12,1),3},{c(12,2),3},{c(12,3),3}}.
{{s(13,0),4},{s(13,1),4},{s(13,2),4}}.
{{s(13,3),4},{c(12,4),6},{c(12,5),7}}.
{{c(12,6),7},{s(13,4),7},{s(13,5),7}}.
{{s(13,6),8},{c(12,7),10},{s(13,7),11}}.
{{s(13,8),11},{c(12,8),13},{s(13,9),15}}.
{{c(12,9),17},{s(13,10),19},{c(12,10),34}}.
{{c(12,11),38},{s(13,11),38}}.

Grouping for Column 14
(m)  {{p(15,1),0},{p(14,2),0},{p(13,3),0}}.
{{p(12,4),0},{p(11,5),0},{p(10,6),0}}.
{{p(9,7),0},{p(8,8),0},{p(7,9),0}}.
{{p(6,10),0},{p(5,11),0},{p(4,12),0}}.
{{p(3,13),0},{p(2,14),0},{p(1,15),0}}.
{{c(13,0),3},{c(13,1),3},{c(13,2),3}}.
{{c(13,3),3},{s(14,0),4},{s(14,1),4}}.
{{s(14,2),4},{s(14,3),4},{s(14,4),4}}.
{{c(13,4),6},{c(13,5),6},{c(13,6),7}}. ← 60
{{s(14,5),7},{s(14,6),8},{s(14,7),8}}.
{{s(13,7),10},{c(13,8),10},{s(14,8),11}}.
{{s(14,9),12},{c(13,9),14},{s(14,10),15}}.
{{c(13,10),18},{s(14,11),19},{c(13,11),37}}.
{{c(13,12),41},{s(14,12),41}}.

Grouping for Column 15
(n)  {{p(15,0),0},{p(14,1),0},{p(13,2),0}}.
{{p(12,3),0},{p(11,4),0},{p(10,5),0}}.
{{p(9,6),0},{p(8,7),0},{p(7,8),0}}.
{{p(6,9),0},{p(5,10),0},{p(4,11),0}}.
{{p(3,12),0},{p(2,13),0},{p(1,14),0}}.
{{p(0,15),0},{c(14,0),3},{c(14,1),3}}.
{{c(14,2),3},{c(14,3),3},{c(14,4),3}}.
{{s(15,0),4},{s(15,1),4},{s(15,2),4}}.
{{s(15,3),4},{s(15,4),4},{c(14,5),6}}.
{{c(14,6),7},{c(14,7),7},{s(15,5),7}}.
{{s(15,6),7},{s(15,7),8},{c(14,8),10}}. ← 61
{{s(15,8),10},{c(14,9),11},{s(15,9),11}}.
{{c(14,10),14},{s(15,10),14},{s(15,11),15}}.
{{c(14,11),18},{s(15,12),19},{c(14,12),40}}.
{{c(14,13),44},{s(15,13),44}}.

Grouping for Column 16
(o)  {{p(14,0),0},{p(13,1),0},{p(12,2),0}}.
{{p(11,3),0},{p(10,4),0},{p(9,5),0}}.
{{p(8,6),0},{p(7,7),0},{p(6,8),0}}.
{{p(5,9),0},{p(4,10),0},{p(3,11),0}}.
{{p(2,12),0},{p(1,13),0},{p(0,14),0}}.
{{c(15,0),3},{c(15,1),3},{c(15,2),3}}.
{{c(15,3),3},{c(15,4),3},{s(16,0),4}}.
{{s(16,1),4},{s(16,2),4},{s(16,3),4}}.
{{s(16,4),4},{c(15,5),6},{c(15,6),6}}.
{{c(15,7),7},{s(16,5),7},{s(16,6),8}}.
{{s(16,7),8},{c(15,8),9},{c(15,9),10}}.
{{s(16,8),10},{s(16,9),12},{c(15,10),13}}. ← 62
{{c(15,11),14},{s(16,10),14},{s(16,11),17}}.
{{c(15,12),18},{s(16,12),21},{c(15,13),43}}.
{{c(15,14),47},{s(16,13),47}}.

Grouping for Column 17
(p)  {{p(13,0),0},{p(12,1),0},{p(11,2),0}}.
{{p(10,3),0},{p(9,4),0},{p(8,5),0}}.
{{p(7,6),0},{p(6,7),0},{p(5,8),0}}.
{{p(4,9),0},{p(3,10),0},{p(2,11),0}}.
{{p(1,12),0},{p(0,13),0},{c(16,0),3}}.
{{c(16,1),3},{c(16,2),3},{c(16,3),3}}.
{{c(16,4),3},{s(17,0),4},{s(17,1),4}}.
{{s(17,2),4},{s(17,3),4},{c(16,5),6}}.
{{c(16,6),7},{s(17,4),7}}.
{{s(17,5),7},{s(17,6),8},{c(16,8),9}}.
{{s(17,7),10},{c(16,9),11},{s(17,8),11}}.
{{c(16,10),13},{s(17,9),13},{s(17,10),15}}.
{{c(16,11),16},{s(17,11),19},{c(16,12),20}}.
{{s(17,12),24},{c(16,13),46},{c(16,14),50}}.

Grouping for Column 18
(q)  {{p(12,0),0},{p(11,1),0},{p(10,2),0}}.
{{p(9,3),0},{p(8,4),0},{p(7,5),0}}.
{{p(6,6),0},{p(5,7),0},{p(4,8),0}}.
{{p(3,9),0},{p(2,10),0},{p(1,11),0}}.
{{p(0,12),0},{c(17,0),3},{c(17,1),3}}.
{{c(17,2),3},{c(17,3),3},{s(18,0),4}}.
{{s(18,1),4},{s(18,2),4},{s(18,3),4}}.
{{c(17,4),6},{c(17,5),6},{c(17,6),7}}.
{{s(18,4),7},{s(18,5),8},{s(18,6),8}}.
{{c(17,7),9},{c(17,8),10},{s(18,7),11}}.
{{c(17,9),12},{s(18,8),12},{c(17,10),14}}.
{{s(18,9),15},{c(17,11),18},{s(18,10),18}}.
{{s(18,11),22},{c(17,12),23},{c(17,13),53}}.

Grouping for Column 19
(r)  {{p(11,0),0},{p(10,1),0},{p(9,2),0}}.
{{p(8,3),0},{p(7,4),0},{p(6,5),0}}.
{{p(5,6),0},{p(4,7),0},{p(3,8),0}}.
{{p(2,9),0},{p(1,10),0},{p(0,11),0}}.
{{c(18,0),3},{c(18,1),3},{c(18,2),3}}.
{{c(18,3),3},{s(19,0),4},{s(19,1),4}}.
{{s(19,2),4},{s(19,3),4},{c(18,4),6}}.
{{c(18,5),7},{c(18,6),7},{s(19,4),7}}.
{{s(19,5),8},{c(18,7),10},{s(19,6),10}}.
{{c(18,8),11},{s(19,7),11},{c(18,9),14}}.
{{s(19,8),14},{c(18,10),17},{s(19,9),18}}.
{{c(18,11),21},{s(19,10),22},{c(18,12),56}}.

Grouping for Column 20
(s)  {{p(10,0),0},{p(9,1),0},{p(8,2),0}}.
{{p(7,3),0},{p(6,4),0},{p(5,5),0}}.
{{p(4,6),0},{p(3,7),0},{p(2,8),0}}.
{{p(1,9),0},{p(0,10),0},{c(19,0),3}}.
{{c(19,1),3},{c(19,2),3},{c(19,3),3}}.
{{s(20,0),4},{s(20,1),4},{s(20,2),4}}.
{{c(19,4),6},{c(19,5),7},{s(20,3),7}}.
{{s(20,4),7},{s(20,5),8},{c(19,6),9}}.
{{c(19,7),10},{s(20,6),11},{c(19,8),13}}.

TABLE 2-continued
Interconnects for a 16 × 16 Multiplier
Each list represents a set of full adder inputs.

|   |   |
|---|---|
|   | {{s(20,7),13},{c(19,9),17},{s(20,8),17}}. |
|   | {{c(19,10),21},{s(20,9),21},{c(19,11),59}}. |
|   | Grouping for Column 21 |
| (t) | {{p(9,0),0},{p(8,1),0},{p(7,2),0}}. |
|   | {{p(6,3),0},{p(5,4),0},{p(4,5),0}}. |
|   | {{p(3,6),0},{p(2,7),0},{p(1,8),0}}. |
|   | {{p(0,9),0},{c(20,0),3},{c(20,1),3}}. |
|   | {{c(20,2),3},{s(21,0),4},{s(21,1),4}}. |
|   | {{s(21,2),4},{c(20,3),6},{c(20,4),6}}. |
|   | {{c(20,5),7},{s(21,3),7},{s(21,4),8}}. |
|   | {{c(20,6),10},{s(21,5),10},{c(20,7),12}}. |
|   | {{s(21,6),12},{c(20,8),16},{s(21,7),16}}. |
|   | {{c(20,9),20},{s(21,8),20},{c(20,10),62}}. |
|   | Grouping for Column 22 |
| (u) | {{p(8,0),0},{p(7,1),0},{p(6,2),0}}. |
|   | {{p(5,3),0},{p(4,4),0},{p(3,5),0}}. |
|   | {{p(2,6),0},{p(1,7),0},{p(0,8),0}}. |
|   | {{c(21,0),3},{c(21,1),3},{c(21,2),3}}. |
|   | {{s(22,0),4},{s(22,1),4},{s(22,2),4}}. |
|   | {{c(21,3),6},{c(21,4),7},{s(22,3),7}}. |
|   | {{s(22,4),8},{c(21,5),9},{c(21,6),11}}. |
|   | {{s(22,5),11},{c(21,7),15},{s(22,6),15}}. |
|   | {{c(21,8),19},{s(22,7),19},{c(21,9),65}}. |
|   | Grouping for Column 23 |
| (v) | {{p(7,0),0},{p(6,1),0},{p(5,2),0}}. |
|   | {{p(4,3),0},{p(3,4),0},{p(2,5),0}}. |
|   | {{p(1,6),0},{p(0,7),0},{c(22,0),3}}. |
|   | {{c(22,1),3},{c(22,2),3},{s(23,0),4}}. |
|   | {{s(23,1),4},{c(22,3),6},{c(22,4),7}}. |
|   | {{s(23,2),7},{s(23,3),8},{c(22,5),10}}. |
|   | {{s(23,4),11},{c(22,6),14},{s(23,5),14}}. |
|   | {{c(22,7),18},{s(23,6),18},{c(22,8),68}}. |
|   | Grouping for Column 24 |
| (w) | {{p(6,0),0},{p(5,1),0},{p(4,2),0}}. |
|   | {{p(3,3),0},{p(2,4),0},{p(1,5),0}}. |
|   | {{p(0,6),0},{c(23,0),3},{c(23,1),3}}. |
|   | {{s(24,0),4},{s(24,1),4},{c(23,2),6}}. |
|   | {{c(23,3),7},{s(24,2),7},{c(23,4),10}}. |
|   | {{s(24,3),10},{c(23,5),13},{s(24,4),14}}. |
|   | {{c(23,6),17},{s(24,5),18},{c(23,7),71}}. |
|   | Grouping for Column 25 |
| (x) | {{p(5,0),0},{p(4,1),0},{p(3,2),0}}. |
|   | {{p(2,3),0},{p(1,4),0},{p(0,5),0}}. |
|   | {{c(24,0),3},{c(24,1),3},{s(25,0),4}}. |
|   | {{s(25,1),4},{c(24,2),6},{s(25,2),8}}. |
|   | {{c(24,3),9},{s(25,3),12},{c(24,4),13}}. |
|   | {{c(24,5),17},{s(25,4),17},{c(24,6),74}}. |
|   | Grouping for Column 26 |
| (y) | {{p(4,0),0},{p(3,1),0},{p(2,2),0}}. |
|   | {{p(1,3),0},{p(0,4),0},{c(25,0),3}}. |
|   | {{c(25,1),3},{s(26,0),4},{c(25,2),7}}. |
|   | {{s(26,1),7},{c(25,3),11},{s(26,2),11}}. |
|   | {{s(26,3),15},{c(25,4),16},{c(25,5),77}}. |
|   | Grouping for Column 27 |
| (z) | {{p(3,0),0},{p(2,1),0},{p(1,2),0}}. |
|   | {{p(0,3),0},{c(26,0),3},{s(27,0),4}}. |
|   | {{c(26,1),6},{s(27,1),8},{c(26,2),10}}. |
|   | {{c(26,3),14},{s(27,2),14},{c(26,4),80}}. |
|   | Grouping for Column 28 |
| (aa) | {{p(2,0),0},{p(1,1),0},{p(0,2),0}}. |
|   | {{c(27,0),3},{s(28,0),4},{c(27,1),7}}. |
|   | {{s(28,1),11},{c(27,2),13},{c(27,3),83}}. |
|   | Grouping for Column 29 |
| (bb) | {{p(1,0),0},{p(0,1),0},{c(28,0),3}}. |
|   | {{s(29,0),7},{c(28,1),10},{c(28,2),86}}. |
|   | Grouping for Column 30 |
| (cc) | {{p(0,0),0},{c(29,0),6},{c(29,1),89}} . |

TABLE 3
MULTOPT Program Listing

```
/* generate optimum multiplier */
<-dcio(carrys,output,file,carry,data,a,v,70).
<-dcio(groups,output,file,group,data,a,v,70).
closef <- dcio(carrys,close) & dcio(groups,close).
/* column one is starting point */
carry_outputs( 1,{{c(1,0),3}} ).
carry_delay( 3 ).
```

TABLE 3-continued
MULTOPT Program Listing

```
sum_delay( 4 ).
/* generate column connections for all columns */
doall <- M := 2 & gen_col(2) & M1 := M + 1 & gen_rest(M1).
gen_rest(31).
gen_rest(M) <-
    gen_col(M) &
    M1 := M + 1 & / &
    gen_rest(M1).
/* generate column connections - first generate a list of column
   and then reduce the list through grouping */
gen_col( M ) <-
    le(M,15) &
    st_to_nb(N,M) & stconc('Grouping for Column',N,Z) &
    nl(groups) & prst(Z,groups) & nl(groups) &
    nl(groups) &
    gen_inputs( M,InList ) &
    gen_group( M,O,InList,*,{},CarryoutList ) &
    write( carry_outputs(M,CarryoutList),carrys ) &
    addax(carry_outputs(M,CarryoutList)).
gen_col( M ) <-
    st_to_nb(N,M) & stconc('Grouping for Column',N,Z) &
    nl(groups) & prst(Z,groups) & nl(groups) &
    nl(groups) &
    gen_inputs( M,InList ) &
    gen_group( M,O,InList,*,{},CarryoutList ) &
    write( carry_outputs(M,CarryoutList),carrys ) &
    addax( carry_outputs(M,CarryoutList)).
/* generate list of inputs to a particular column    */
/* carry out list is assumed to be sorted in ascending order */
gen_inputs( N,L ) <-
    part_prod( N,L1 ) &
    N1 := N - 1 &
    carry_outputs( N1,L2 ) & ·
    append( L1,L2,L ).
/* generate partial products, given a column number */
part_prod( 0,{p(15,15),0} ).
part_prod( N,L ) <-le(N,15) & N1 := 15 - N &
    pp_gen( 15,N1,L ) & /.
part_prod( N,L ) <-N1 := 15 - (N - 15) & pp_gen( N1,0,L ).
pp_gen( -1,*,{} ).
pp_gen( *,16,{} ).
pp_gen( M,N,{{p(M,N),0}|L} ) <-
    M1 := M - 1 & N1 := N + 1 &
    pp_gen( M1,N1,L ).
/* generate optimum grouping for a specific column */
gen_group( *,*,{{s(*,*),*}},{},C_List,C_List).
gen_group( M,N,InList,InList2,C_List,C_List2 ) <-
    group( M,N,InList,InList1,C_List,C_List1 ) &
/*  write(InList,groups) & nl(groups) & */
    N1 := N + 1 &
    gen_group( M,N1,InList1,InList2,C_List1,C_List2).
/* take first n elements of InList, find max delay and  */
/* based on above insert a sum element into the inputs list */
/* to generate InListMod, also insert carry out delay  */
/* into the carry out list                             */
group( M,N,InList,InListMod,CarryList,CarryListMod ) <-
    first_3_of_list( InList,InFirst,InList1 ) &
    write(InFirst,groups) &      /* save group info */
    max_delay( InFirst,Max ) &
    calc_delay( Max,Sum_delay,Carry_delay ) &
    insert( {c(M,N),Carry_delay},CarryList,CarryListMod ) &
    insert( {s(M,N),Sum_delay},InList1,InListMod ).
insert( Element,{},{Element} ).
insert( Element,{Head|List},{Head|OutList} ) <-
    get_delay( Element,Element_delay ) &
    get_delay( Head,Head_delay ) &
    ge(Element_delay,Head_delay) & / &
    insert( Element,List,OutList ).
Insert( Element,{Head|List},{Element,Head|List} ) <-
    get_delay( Element,Element_delay ) &
    get_delay( Head,Head_delay ) &
    lt(Element_delay,Head_delay) & /.
max_delay( {},0 ).
max_delay( {Head|List},Max ) <-
    get_delay( Head,Delay ) &
    max_delay( List,Max1 ) &
    Max := max( Delay,Max1).
get_delay( {Element,Delay},Delay ).
calc_delay( In_delay,Sum_delay,Carry_delay ) <-
    sum_delay(S) &
    Sum_delay := In_delay + S &
```

TABLE 3-continued

MULTOPT Program Listing

```
    carry_delay(C) &
    Carry_delay := In_delay + C.
/* take first three elements from list if list is long enough
   otherwise return the list */
first_3_of_list( L,Head,Rest ) <-
    length( L,Len) &
    gt(Len,2) &
    length( Head,3 ) &
    append( Head,Rest,L ) & /.
first _3_of_list( L,L,{} ).
/* Utility functions */
length(L,N) <- var(L) & int(N) &/& genlist(L,N).
length(L,N) <- length1(L,N).
length1({},0).
length1({A]B},N) <-length1(B,N1) & sum(N1,1,N).
genlist({},0) <-/.
genlist({X]Xs},N) <- diff(N,1,N1) & genlist(Xs,N1).
```

What is claimed is:

1. A method of interconnecting a plurality of logic adder circuits to create a multiplier with minimum internal time delays, said method comprising the following steps:
   a) laying out an array of said adder circuits in rows and columns, each of said adder circuits having a plurality of inputs and at least two outputs, one of the outputs being directed serially to one of said adder circuits in the same column and the other output being directed to one of said adder circuits in an adjacent column;
   b) measuring the time value of each input pulse applied to each of said adder circuits in a first row of said array;
   c) measuring the time value of each output pulse of each of said adder circuits in the first row of said array;
   d) repeating said step b) for each subsequent row of said array;
   e) repeating said step c) for each subsequent row of said array;
   f) arranging the time values from said steps c) and e) in order;
   g) directing each output, being directed serially to said one of said adder circuits in the same column, to one of the inputs of an adder circuit in said same column whose other inputs have a time value equal to a time value of the selected output or equal to the next greatest available time value, and
   h) directing each output of each of said adder circuits, being directed to an additional column, to an adder circuit whose other inputs have a time value equal to a time value of the selected output or equal to the next greatest available time value.

2. The method as claimed in claim 1, wherein said rows and columns define a plurality of adder stages of said multiplier, and wherein a last adder stage of said multiplier comprises a carry look ahead adder.

3. The method as claimed in claim 1, wherein said step f) is performed so as to arrange said time values in ascending order.

4. An apparatus for interconnecting, within a cell array multiplier, a plurality of adder circuits arranged in an array of rows and columns, each of said adder circuits having a plurality of inputs and at least two outputs, one of the outputs being directed serially to one of said adder circuits in the same column and the other output being directed to one of said adder circuits in an adjacent column, said apparatus comprising:
   means for measuring the time value of each input pulse applied to each of said adder circuits in each row of said array to provide a plurality of input time pulses;
   means for measuring the time value of each output pulse of each of said adder circuits in each row of said array to provide a plurality of output time pulses;
   means for arranging said output time pulses in order; and
   means for directing outputs of said adder circuits to inputs of others of said adder circuits based on said order.

5. An apparatus as claimed in claim 4, wherein said directing means includes means for directing each output, being directed serially to said one of said adder circuits int he same column, to one of the inputs of an adder circuit in said same column whose other inputs have a time value equal to a time value of the selected output or equal to the next greatest available time value.

6. An apparatus as claimed in claim 4, wherein said directing means includes means for directing each of said adder circuits, being directed to an additional column, to an adder circuit whose other inputs have a time value equal to a time value of the selected output or equal to the next greatest available time value.

7. A method of interconnecting a plurality of logic adder circuits to create a multiplier with minimum internal time delays, said method comprising the following steps:
   laying out an array of said adder circuits in rows and columns, each of said adder circuits having a plurality of inputs and at least two outputs, one of the outputs being directed serially to one of said adder circuits in the same column and the other output being directed to one of said adder circuits in an adjacent column;
   measuring the time value of each input pulse applied to each of said adder circuits in each row of said array to provide a plurality of input time pulses;
   measuring the time value of each output pulse of each of said adder circuits in each row of said array to provide a plurality of output time pulses;
   arranging said output time pulses in order; and
   directing outputs of said adder circuits to inputs of others of said adder circuits based on said order.

8. The method as claimed in claim 7, wherein said directing step includes directing each output, being directed serially to said one of said adder circuits in the same column, to one of the inputs of an adder circuit in said same column whose other inputs have a time value equal to a time value of the selected output or equal tot he next greatest available time value.

9. The method as claimed in claim 7, wherein said directing step includes directing each output of each of said adder circuits, being directed to an additional column, to an adder circuit whose other inputs have a time value equal to a time value of the selected output or equal to the next greatest available time value.

* * * * *